(12) United States Patent
Regalbuto et al.

(10) Patent No.: US 7,216,909 B2
(45) Date of Patent: May 15, 2007

(54) BREAKAWAY MANDREL FOR TRANSPORTING DISKS

(75) Inventors: Michael A. Regalbuto, Santa Clara, CA (US); Ken P. Reed, Sunnyvale, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 59 days.

(21) Appl. No.: 10/849,849

(22) Filed: May 21, 2004

(65) Prior Publication Data

US 2005/0258659 A1  Nov. 24, 2005

(51) Int. Cl.
*B66C 1/42* (2006.01)
(52) U.S. Cl. .................. 294/87.1; 294/86.4; 901/49
(58) Field of Classification Search ........... 294/87.1, 294/93, 86.4; 414/908, 414, 416; 901/49
See application file for complete search history.

(56) References Cited

U.S. PATENT DOCUMENTS

| | | | | |
|---|---|---|---|---|
| 4,957,406 A | * | 9/1990 | Akagawa | ............... 414/416.02 |
| 4,958,873 A | * | 9/1990 | Akagawa | ....................... 294/93 |
| 5,131,800 A | * | 7/1992 | Akagawa | ............... 414/416.02 |
| 5,259,719 A | * | 11/1993 | Akagawa | ............... 414/416.08 |
| 5,423,653 A | * | 6/1995 | Harper | ....................... 414/680 |
| 6,231,732 B1 | | 5/2001 | Hollars et al. | |
| 6,236,177 B1 | * | 5/2001 | Zick et al. | ................... 318/362 |
| 6,847,181 B2 | * | 1/2005 | Brooks et al. | .......... 318/568.11 |

* cited by examiner

*Primary Examiner*—Gene O. Crawford
*Assistant Examiner*—Esther Onyinyechi Okezie
(74) *Attorney, Agent, or Firm*—McDermott Will & Emery LLP

(57) ABSTRACT

An end-effector that loads disks into a pallet of a sputtering machine, for example, has a two-piece mandrel with a rigid inner core and a plastic outer sleeve slideably axially mounted on the core. The sleeve is attached to the core with a coupling providing a predetermined attachment force. A breakaway force exerted on the sleeve that exceeds the attachment force causes the sleeve to separate from the mandrel, this separation being sensed by a breakaway sensor.

7 Claims, 8 Drawing Sheets

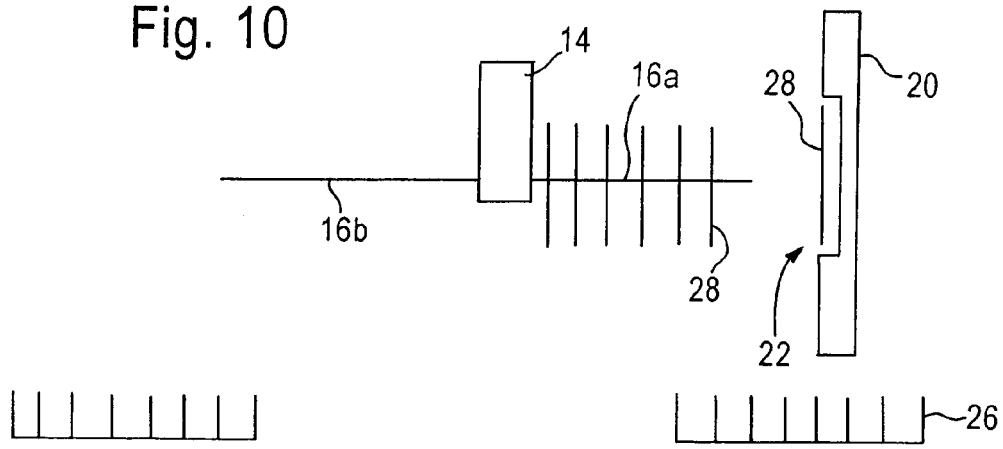
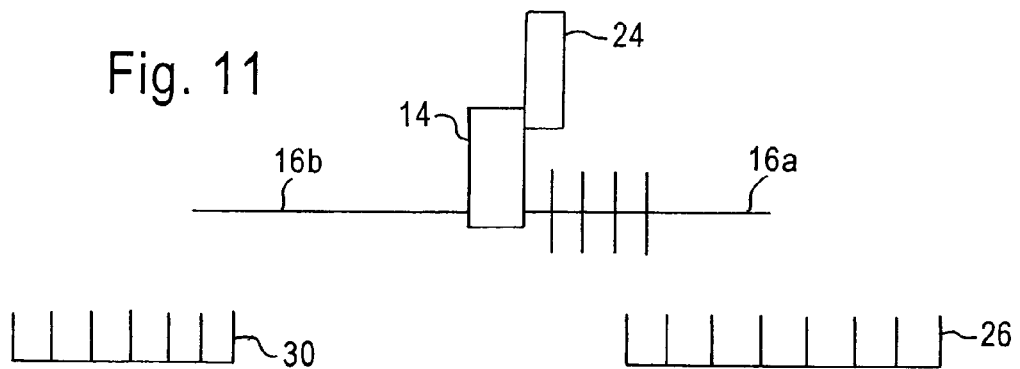

BREAKAWAY MANDREL FOR TRANSPORTING DISKS

FIELD OF THE INVENTION

The present invention relates to the handling of disk media during a transfer process, and more specifically, to a robotic end-effector and mandrel for picking a series of axially aligned disks from a presentation location and loading the disks into a transfer pallet.

BACKGROUND OF THE INVENTION

Hard disk drives provide fast non-volatile, rewritable and economical computer memory. Most disk media, such as magnetic hard disks, magneto-optical disks and phase-change optical disks, involve codings by various deposition techniques such as sputtering or chemical deposition. One of the types of sputtering machines for sputter-deposition of a succession of various layers onto the disk surfaces to produce the memory media is an in-line (or "pass-through") machine. Such a machine includes either a linear arrangement of relatively small, individual but connected chambers, or one or two long chambers with vacuum transition locks at each end of the line. Processing stations are located either along the long chambers or in each individual chamber. During deposition, a multiple-disk substrate carrier, called a pallet, continuously passes in front of the sputtering targets or sources.

In high-speed operations, load robots are employed to transfer disk media from a presentation location to load the disks into a transfer pallet. Using the end-effector, the robot picks a group or series of axially aligned disks from the presentation location, and places the disks one at a time into the pallet.

A previous design of a robotic end-effector used by load robots to transfer disk media employs two opposing mandrels mounted to a central hub. The mandrel is a one-piece cantilever design constructed from "PEEK" plastic, and has thirteen slots for holding disks. In operation, the robot inserts the mandrel into the center of the axially aligned disks at the presentation location, removes them from the presentation location, and subsequently places the disks one at a time into the transfer pallet. There are certain concerns related to the conventional device, caused by the one-piece mandrel design made of plastic. These concerns include quality, throughput and line yield loss.

Scratches and dings in a disk may be caused by inaccurate placement of the disk in the pallet by the robot, affecting the quality of the disk. Dimensional instability of the plastic material of the one-piece mandrel, as well as the flexure of the mandrel, may be a major factor in the accuracy of the placement of disks into the pallet. Another quality factor is the ability to track the disk products through the factory. For example, a product may be tracked in lots of twenty-five disks. Using a mandrel having a different number of slots than the disk lot size causes the lots to be broken up and disordered during a transfer process. This makes product tracking more difficult and prone to errors.

Another concern with conventional design relates to the throughput. Using a thirteen-slot mandrel design, the robot may frequently run out of disks while loading a pallet. The robot must then take time out from the loading to resupply itself with disks, causing a reduction in throughput. Another throughput factor is the relatively limited payload that can be carried by the one-piece plastic design, due to the flexure of the plastic mandrel under load. As such, the plastic design of the mandrel may not work well with next generation media form-factors, which are expected to be heavier. Another throughput issue is that periodic maintenance is difficult and time consuming, causing lost production while a technician replaces and recalibrates the one-piece plastic mandrels.

A still further concern regards line yield loss. Over time, placement accuracy of a disk into the pallet can degrade to the point where disks are misloaded in the pallet. The degrading of the placement accuracy may be due to the one-piece plastic design of the mandrel. The disks will either fall out onto the ground, or fall back into the mandrel and have to be removed. In either event, the disks become scrap. Further, in the event of a severe misload of a disk into the pallet, the disk can get lodged such that the robot rips the disk out of the pallet, resulting in damage to the pallet, the mandrel, and any previously placed disks. Also, error recovery from misloads has a significant impact on line yield loss.

SUMMARY OF THE INVENTION

There is a need for a robotic end-effector and mandrel arrangement that provides increased rigidity, dimensional stability and payload, yet limits pallet damage in the event of a severe misload. The arrangement should also allow a robot to pick entire lots of disks, be easy to service and require minimum time and labor to change out.

These and other needs are met by embodiments of the present invention which provide a robotic end-effector for transporting disks, comprising a robot having a central hub, and a first mandrel held by the central hub. The first mandrel has an inner core and an outer sleeve slideably axially mounted on the core. This sleeve has external grooves configured to hold a plurality of disks. An attachment arrangement is provided for releasably attaching the sleeve to the core with a predetermined attachment force. This sleeve is slideably axially removable from the core when a breakaway force exerted on the sleeve is greater than the attachment force.

The earlier stated needs are also met by other embodiments of the present invention which provide a mandrel for transporting disks. The mandrel comprises a longitudinally extending rigid core and a sleeve having a bore through which the core extends when the sleeve and the core are in an assembled position. This sleeve has an outer circumference with grooves for retaining disks. A releasable securement arrangement secures the sleeve on the core and releases the sleeve from the core upon application of a predetermined force on the sleeve.

The earlier stated needs are also met by other aspects of the present invention which provide a mandrel for transporting disks, the mandrel comprising a sleeve with grooves for retaining disks and a core slideably received within the sleeve. Means are provided for releasably securing the sleeve to the core and detecting releasing of the securing of the sleeve to the core.

The foregoing and other features, aspects and advantages of the present invention will become more apparent from the following detailed description of the present invention when taken in conjunction with the accompanying drawings.

BRIEF DESCRIPTION OF THE DRAWINGS

FIGS. 7–18 schematically depict sequential steps in a process for loading disks from a presentation location to a pallet employing the end-effector of the present invention.

DETAILED DESCRIPTION OF THE INVENTION

The present invention addresses and solves problems related to the pick-and-place transfer of disks from a presentation location, such as a pick-up comb, into a pallet, employing a robotic end-effector. The present invention solves the problems associated with prior devices by providing the end-effector with two-piece mandrels employing a rigid core that is covered by a plastic sleeve. The rigid core, which is made of steel, for example, prevents flexure and drooping of the plastic sleeve. This provides increased dimensional stability as well as increases throughput due to the potential for increased payload. Further, the product quality may be improved since entire lots of disks, such as a lot of twenty-five disks, may be handled at one time. By providing the two-piece mandrel with a releasable attachment having a predetermined attachment force, the pallet damage in the event of a severe misload may be limited. This is due to the sleeve being slideably axially removable from the core when a breakaway force exerted on the sleeve is greater than the attachment force. Further, the mandrel is relatively easy to service, requiring minimum time and labor to change out.

Figure 1:
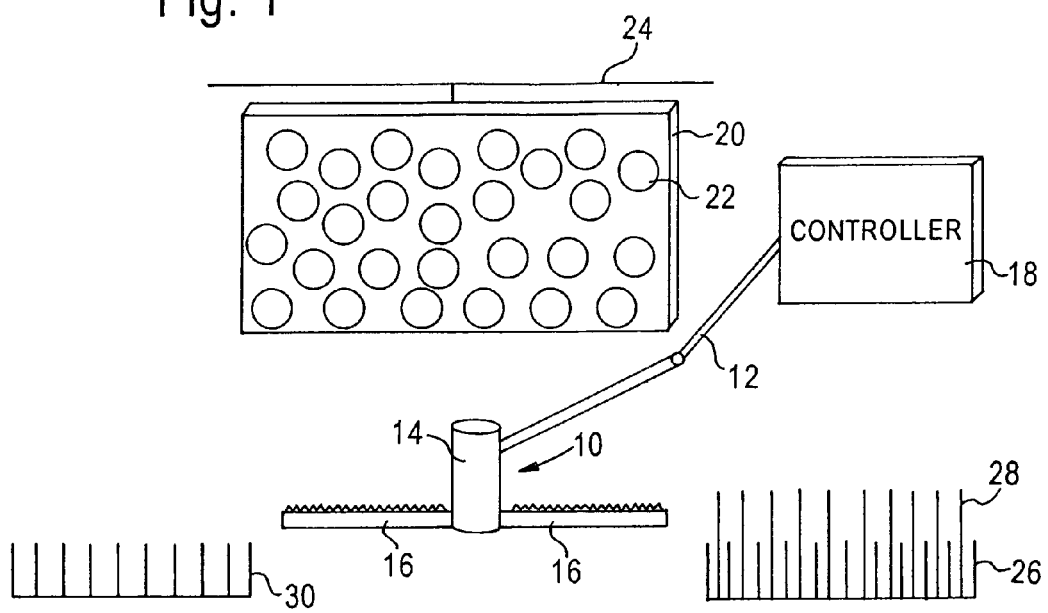
FIG. 1 is a schematic depiction of a transfer station for loading disks from a presentation location to a pallet, in accordance with embodiments of the present invention.

FIG. 1 depicts a transfer or loading station in which an end-effector 10 is provided at the end of a robot arm 12. The end-effector 10 has a central hub 14 that is configured to hold the first and second mandrels 16 in a co-planar 180° orientation from each other. A controller 18 is coupled to the robot arm 12 to control the movement of the central hub 14 and the positioning of the end-effector 10 and movements thereof. Further, the controller 18 receives signals from the mandrels 16, as will be described in more detail.

The end-effector 10 loads disks into a pallet 20 that has a plurality of holes 22 provided therein. The pallet 20 is conveyed in a vertical orientation by a conveyor 24 through the transfer station. A conventional pallet may be a ¼-inch thick aluminum plate roughly 3 feet square into which is machined the array of holes 22. An exemplary pallet 20 may include fifty-six holes, for example.

Although only one robot arm 12 is depicted in FIG. 1, an individual transfer station may employ three load robots with end-effectors 10 that are staggered vertically. Each of the load robots at a transfer station would then place disks into approximately ⅓ of the holes 22 in the pallet 20. Having multiple robots and end-effectors 10 allows the total transfer time to transfer disks into a pallet 20 to be reduced.

Disks 28 are provided to the transfer station at a presentation location at which a pick-up comb 26 is provided. For example, the disks 28 may be transported to the transfer station by an elevator, for example, and placed into the pick-up comb 26.

A shuffle comb 30 is also provided at the transfer station, and serves to operate in conjunction with the mandrels 16 to reposition disks on the mandrels 16 to facilitate loading of the disks 28 into the pallet 20. Also, moving disks 28 towards the tips of the mandrels 16, as will be appreciated, reduces the amount of motion and time required to place disks 28 into the pallet 20. The operation of the end-effector 10 and mandrels 16 with the pick-up comb 26 and the shuffle comb 30 will be described in more detail with respect to FIGS. 7–17.

Figure 2:
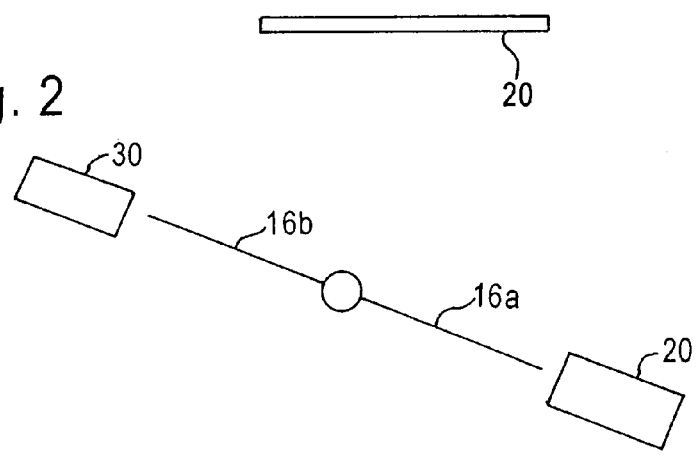
FIG. 2 is a schematic depiction of a planar view of the transfer station of FIG. 1.

FIG. 2 is a planar, schematic view depicting only the end-effector 10, with mandrels 16 attached to the central hub 14, the pick-up comb 26, the shuffle comb 30 and the pallet 20. During operation, the end-effector 10 rotates between the shuffle comb 30, the pick-up comb 26, and the pallet 20 as needed to transfer the disks to the pallet 20.

Figure 3:
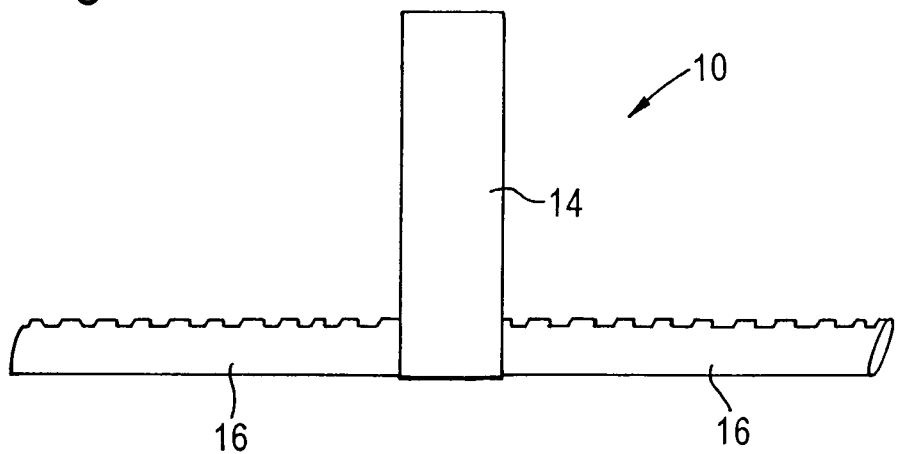
FIG. 3 is an isolated view of an end-effector constructed in accordance with embodiments of the present invention.

FIG. 3 is a more detailed view of the end-effector 10 with a central hub 14 and mandrels 16. The mandrels 16 are provided in a common plane and extend from the central hub 14 in a 180° orientation. A conventional mounting may be employed to connect the mandrels 16 to the central hub 14.

Figure 4:
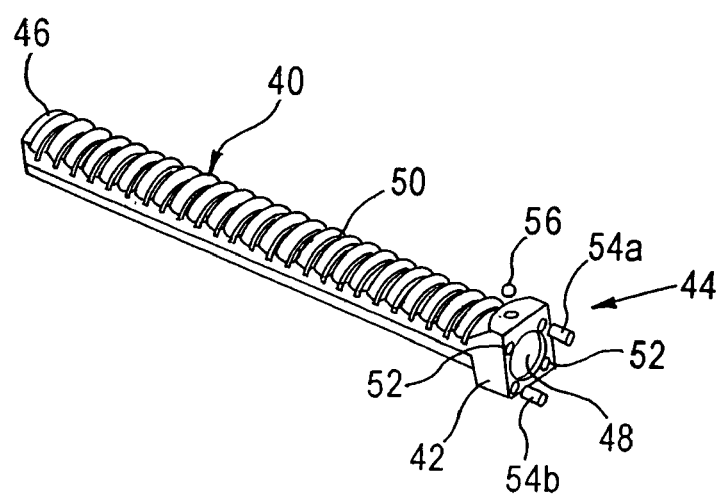
FIG. 4 shows an exploded perspective view of a sleeve of a mandrel constructed in accordance with embodiments of the present invention.

FIG. 4 is a perspective view of an exemplary embodiment of a sleeve 40 forming part of the mandrels 16. This sleeve 40 may be made out of a plastic, such as PEEK plastic, for example. Such material is desirable so that the disks 28 are protected from damage by mandrels 16 during the transfer process.

The sleeve 40 includes a sleeve flange 42 formed at a first axial end 44 of the sleeve 40. The sleeve flange 42 may be made of any appropriate material, such as being formed integrally with the sleeve 40 from plastic, or may also be formed of a different material. The second axial end 46 is located distantly from the sleeve flange 42.

The sleeve has a central bore 48 that extends completely through the sleeve flange 42 and to the second axial end 46. The central bore 48 is sized to slideably receive a core, such as that shown in FIG. 5. The size of the central bore 48 should allow relatively easy sliding of the bore 48 on the core.

The sleeve flange 42 has locating features 52 provided therein. In the illustrated embodiment of FIG. 4, the locating features 52 are bores into which pins may be received. However, this is exemplary only, as other embodiments for precisely locating the sleeve flange 42 to a core flange (seen in FIG. 5) may be employed.

The sleeve flange 42 also carries a part of an attachment arrangement (or "releasable securement arrangement") that operates to releasably attach the sleeve 40 to the core with a predetermined attachment force. In the illustrated embodiment, the attachment arrangement includes magnets 54a, 54b, located at opposite diagonal corners of the sleeve flange 42. The two magnets 54a, 54b have different pole ends exposed, so that the correct orientation of the sleeve 40 on the core will be assured. For example, the magnet 54a may have its north pole end exposed, while the magnet 54b may have its south pole end exposed. In certain preferred embodiments of the invention, the magnets 54a, 54b are made of a neodinium rare earth magnet. As will be described with respect to FIG. 5, corresponding magnets are located in the core flange and interact with the magnets 54a, 54b to provide the attachment force. The use of neodinium rare earth magnets provides a relatively strong attachment force, such as approximately 2.4 pounds, for relatively small sized magnets.

Figure 5:
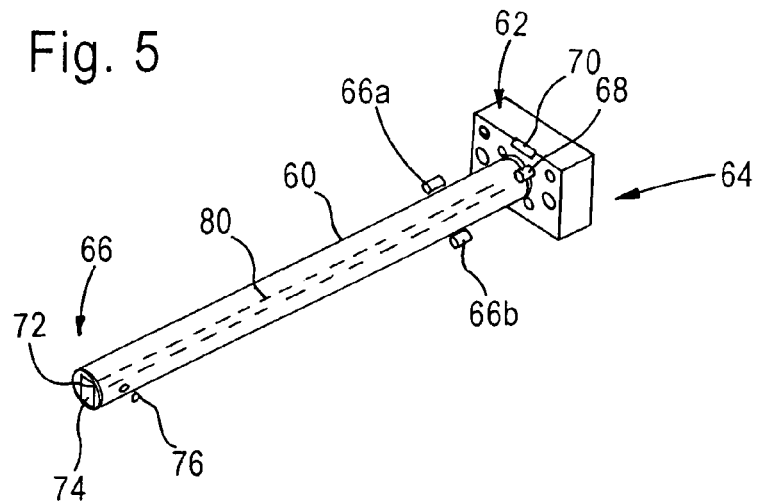
FIG. 5 is an exploded perspective view of a core of a mandrel constructed in accordance with embodiments of the present invention.

FIG. 5 is a perspective view of an exemplary embodiment of a core 60 of the mandrel 16 of the present invention. The core 60 may be made of a rigid material, such as steel, for example. The rigidity of the core 60 ensures that the mandrel 16 will not experience sag or droop and little flexure over time. This high dimensional stability maintains placement accuracy during placement of disks 28 into pallets 20. Further, providing a rigid core 60 allows the mandrels 16 to work with heavier, next-generation media form-factors. Increasing the placement accuracy prevents disk misloads in the pallets 20, or at least reduces the same. This decreases the amount of line yield loss. Further, increasing the placement accuracy prevents severe misloads, with a robot ripping the disk 28 out of a pallet 20, resulting in damage to the pallet 20, the mandrel 16 and any previously placed disks 28.

The core 60 includes a core flange 62 located at a first axial end 64. The core flange 62 includes locating features 68 that interact with the locating features 52 of the sleeve flange 42. In the exemplary illustrated embodiment of FIG. 5, the locating features 68 are pins that are received by the bores 52 in the sleeve flange 42.

The core flange 62 also includes parts of the attachment arrangement (or releasable securement arrangement) that interact with the corresponding features in the sleeve flange 42. For example, magnets 66a, 66b may be provided in the core flange 62 and be precisely located such that they face magnets 54a, 54b, respectively. The magnets 66a, 66b are inserted into the core flange 62 such that the opposite poles to the corresponding respective magnets 54a, 54b are provided at the surface of the core flange 62. In other words, if magnet 54a has its north pole end exposed, magnet 66a has its south pole end exposed such that these two magnets will attract each other when the sleeve 40 is assembled onto the core 60. Similarly, the north pole end of the magnet 66b will be at the surface of the core flange 62, to interact with the south pole end of the magnet 54b.

The attachment force created in certain embodiments is provided to be 2.4 pounds, approximately, which is high enough to provide a secure attachment of the sleeve 40 to the core 60 under full load at normal operational speeds, but low enough to allow a breakaway of the sleeve 40 from the core 60 in the event of a severe misload. This breakaway feature protects the pallet and reduces line yield loss. The strength of the magnets is selected according to calculations for a desired breakaway force. The magnetic coupling should be strong enough that under test conditions, disks will fly off of the mandrels 16 before the mandrel sleeves 40 will fling off the cores 60. Magnetic coupling should also be weak enough, however, so that a breakaway will occur without noticeable deflection of a pallet 20 during a misload.

The breakaway of the sleeve 40 from the core 60 is sensed by a breakaway sensor 70 (schematically depicted) located on the core flange 62. The breakaway sensor 70 senses the presence of a target 56 provided within the sleeve flange 42. One embodiment of the target 56 is a metal ball.

The core 60 has a recess 72 at a second axial end 66 of the core 60. The recess 72 is configured to receive and hold a disk presence sensor 74. A set screw 76 extends through the core 60 to secure the sensor 74 within the recess 72. The disk presence sensor 74 operates to sense disks 28 by sensing in a downward direction 78. Signals from the sensor 74 are provided through a connecting bore 80 through the steel core 60. The sensor 74 may be an optical sensor, for example, with a 90° prism at the end of the sensor 74 to provide a downward direction sensing. A 760 nm light may be employed, for example, to detect the inner diameter of a disk 28. The presence of a disk 28 is sensed after the disk 28 has been placed in a pallet 20 and the mandrel 16 is being withdrawn from the pallet 20. The disk presence sensor 74 provides an indication that a disk 28 has been properly inserted into the pallet 20. Should the sensor 74 indicate a misload or failure to load a disk 28 into the pallet 20, an appropriate action may be taken, such as providing an alarm, stopping operation, skipping the loading of that particular pallet hole 22, etc. The light signal from the disk presence sensor 74 is provided to a fast amplifier (not shown) that converts the optical signals to usable signals for the controller 18.

Figure 6:
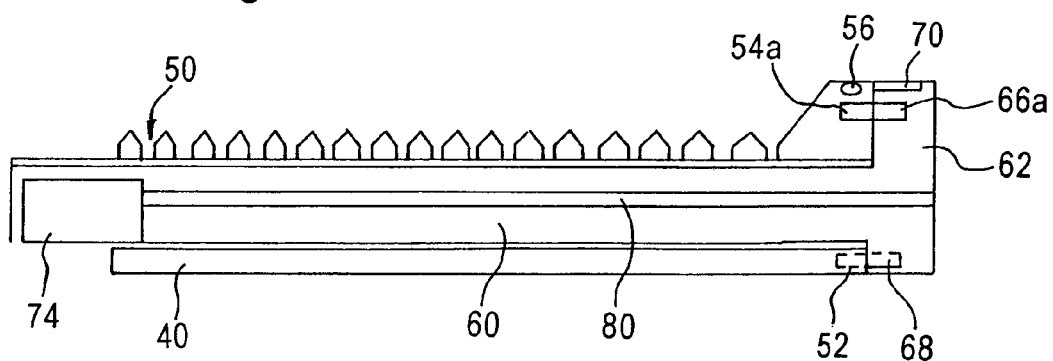
FIG. 6 is a cross-sectional view of a mandrel assembled from the sleeve of FIG. 4 and the core of FIG. 5, in accordance with embodiments of the present invention.

FIG. 6 is a cross-sectional view depicting the mandrel 16 in an assembled condition in which the sleeve flange 42 has been precisely located on the core flange 62. Only one set of locating features, including locating pin 68 and bore 52, are depicted in FIG. 6. The attachment arrangement (or releasable securement arrangement) provides the attachment force to securely hold the sleeve flange 42 against the core flange 62 and the sleeve 40 on the core 60. Only one pair of magnets 54a, 66a are depicted in FIG. 6. A breakaway force may be applied, such as by misloading of a disk 28 into the pallet 20, to cause the sleeve flange 42 to separate from the core flange 62 and withdraw the sleeve 40 from the core 60. In such an event, due to the two-piece modular nature of the mandrel 16, replacement of the sleeve 40 takes minutes of an operator's time, instead of an hour or more as in conventional arrangements. Further, the breaking away of the sleeve 40 in the direction of the breakaway force is sensed immediately so that damage to a pallet 20 and loss of disks 28 can be minimized or avoided.

FIGS. 7–17 schematically depict a transfer operation in accordance with embodiments of the present invention. In these diagrams, reference numeral 16a will refer to a first one of the mandrels 16, while reference numeral 16b refers to a second one of the mandrels 16. Further, for purposes of illustration, a full disk lot size of, for example, twenty-five disks 28, is not shown. The number of disks is only schematically illustrated in this sequence of figures. However, as discussed earlier, it is advantageous to provide a mandrel with the same number of slots as a disk lot size. In the exemplary described embodiment, the disk lot size is twenty-five disks 28, so that the number of disks provided in a full mandrel 16a or 16b will be considered to be twenty-five disks, although a lesser amount will actually be depicted in FIGS. 7–17.

Figure 7:
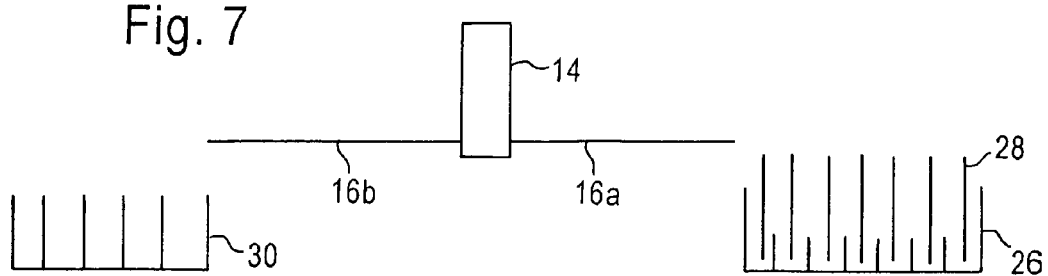

FIG. 7 shows an initial state of the end-effector 10 in which the first and second mandrels 16a, 16b do not have any disks 28 loaded thereon. The shuffle comb 30 is empty and the pick-up comb 26 has a disk lot of twenty-five disks 28 loaded therein.

Figure 8:
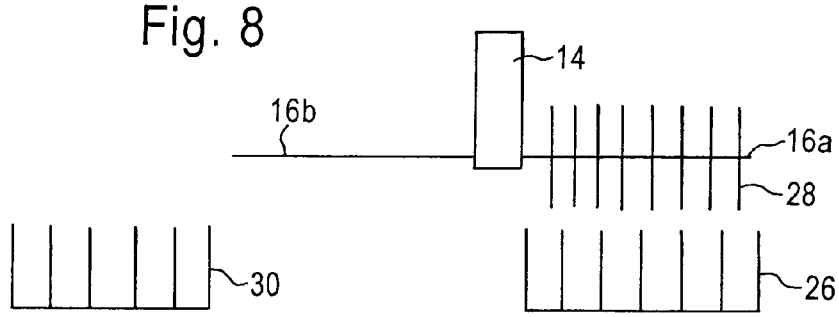

In FIG. 8, the end-effector 10 is manipulated so that the first mandrel 16a is inserted through the inner diameters of each of the disks 28 that are located in the pick-up comb 26. The end-effector 10 is then lifted so that the disks 28 clear the pick-up comb 26. The disks 28 are located in the mandrel grooves 50 (not depicted in FIG. 8) and securely held there.

Figure 9:
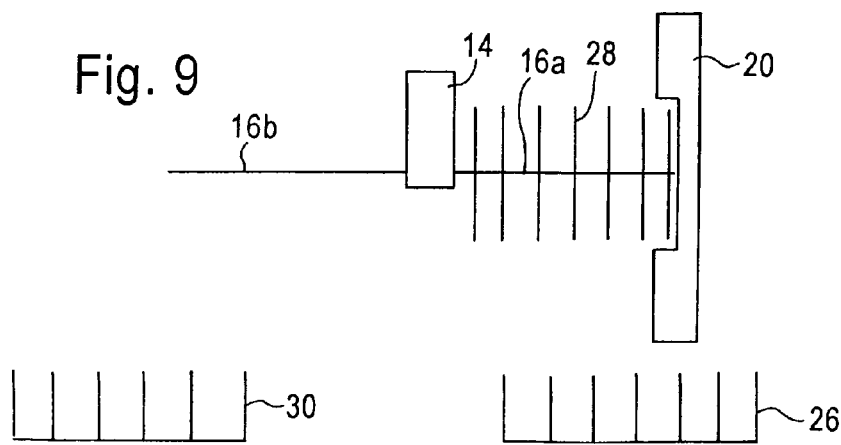

FIG. 9 shows the end-effector 10 having been rotated and positioned to insert the first disk 28 at the tip of the first mandrel 16a into a hole 22 of the pallet 20. The end-effector 10 is then withdrawn, as depicted in FIG. 10. The disk presence sensor 74 detects the presence of the disk 28 within the pallet 22 as the first mandrel 16a is being withdrawn. This now leaves twenty-four disks 28 on the first mandrel 16a.

Figure 12:
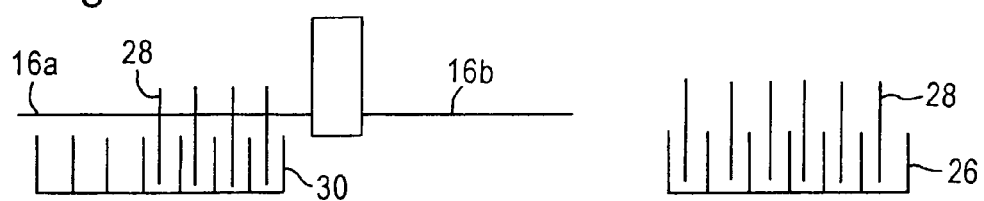
Figure 13:
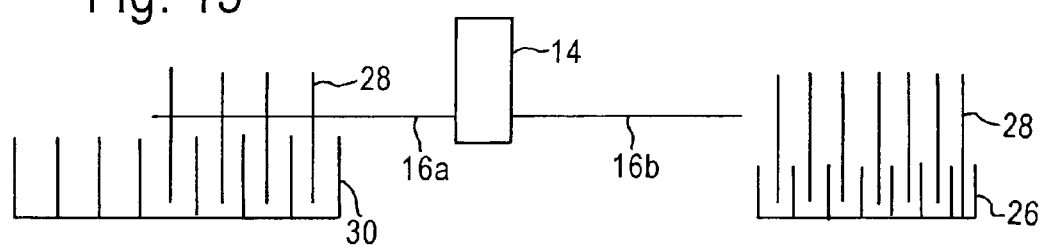
Figure 14:
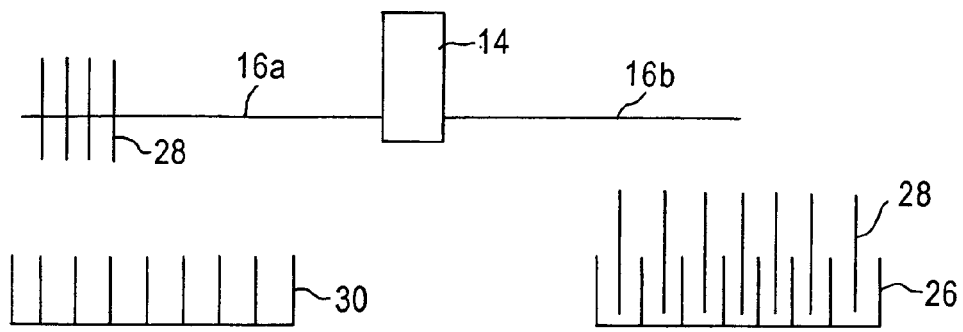

For purposes of this description, assume that the particular robot 12 shown in these figures is assigned to load eighteen disks 28 into each pallet 20. The steps of FIGS. 9 and 10 are repeated until interference between the robot 12 and the pallet conveying mechanism 24 prevents further loading. Interference may occur, for example, after fifteen disks have been loaded, as depicted in FIG. 11. To allow further loading, the remaining ten disks must be shuffled forward on the mandrel as depicted in FIGS. 12 and 13. The end-effector 10 is rotated, as seen in FIG. 12, and the disks are placed into a shuffle comb 30. This is followed, as depicted in FIG. 13, by movement of the end-effector 14 and the first mandrel 16a to position the disks 28 in the shuffle comb 30 towards the second axial end 46 of the sleeve 40 of the first mandrel 16a. Disk shuffling is completed as the disks 28 are picked up from the shuffle comb 30, as depicted in FIG. 14. It should be noted that disk shuffling during loading of the pallet 20 moderately affects loading time. Once shuffling is complete, the steps of FIGS. 9 and 10 are repeated until the complete assignment of eighteen disks 28 is loaded into the pallet 20. Once the first pallet 20 is fully loaded, the pallet 20 exits the transfer station and a second pallet enters the transfer station. At this stage, the remaining seven disks 28 on the first mandrel 16a are shuffled forward toward the second axial end 46 of the sleeve 40, as described above.

Figure 15:
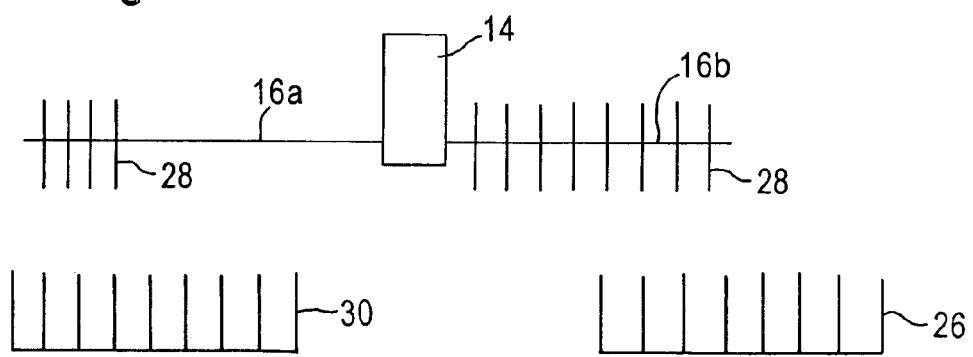

FIG. 15 shows the picking up of a next lot of disks 28 on the second mandrel 16b. The disks 28 are picked up from the pick-up comb 26 in the same manner as earlier depicted in FIG. 8.

Figure 16:
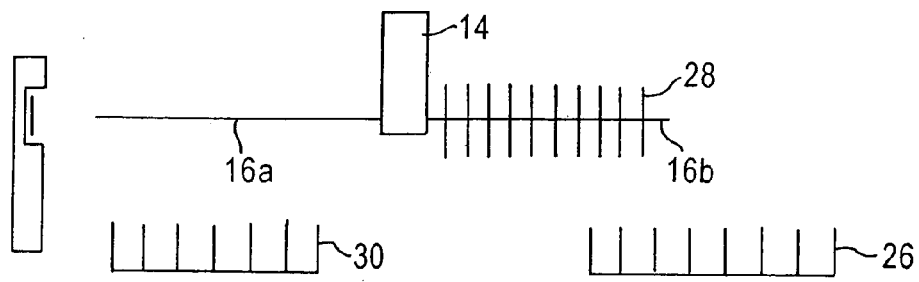

As depicted in FIG. 16, the seven disks 28 are first unloaded from the first mandrel 16a into a second pallet 20 that has entered the transfer station. This empties the first mandrel 16a of disks. The end-effector 10 is then rotated to unload eleven more disks into this next pallet 20, leaving fourteen disks 28 on the second mandrel 16b, towards the first axial end 44 of the sleeve 40 of the second mandrel 16b. It should be noted that the second pallet 20 has been fully loaded with eighteen disks (seven from the first mandrel 16a and eleven from the second mandrel 16b) without having to return to a comb 26 or 30 to obtain more disks. Returning to the combs 26, 30 during loading of the pallet 20 significantly affects loading time. Rotating between the first and second mandrels does not significantly affect loading time.

If at any time during the loading process, such as that depicted in FIG. 16, the breakaway force exceeds the predetermined attachment force, for example is greater than 2.4 pounds in certain embodiments, the sleeve 40 will detach from the core 60. The breakaway will be sensed by the breakaway sensor 70 that provides signals to the controller 18. Appropriate action may then be taken, as discussed earlier.

Figure 17:
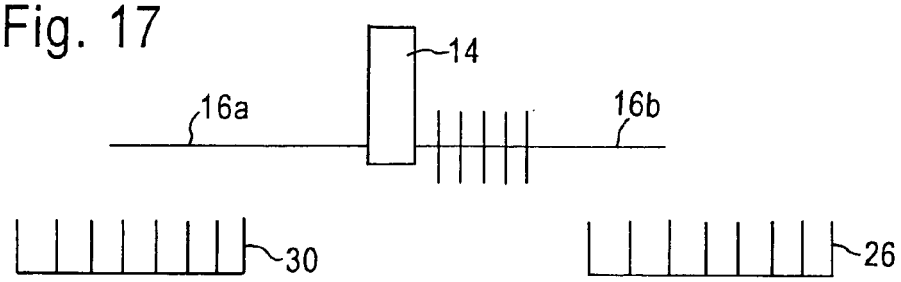
Figure 18:
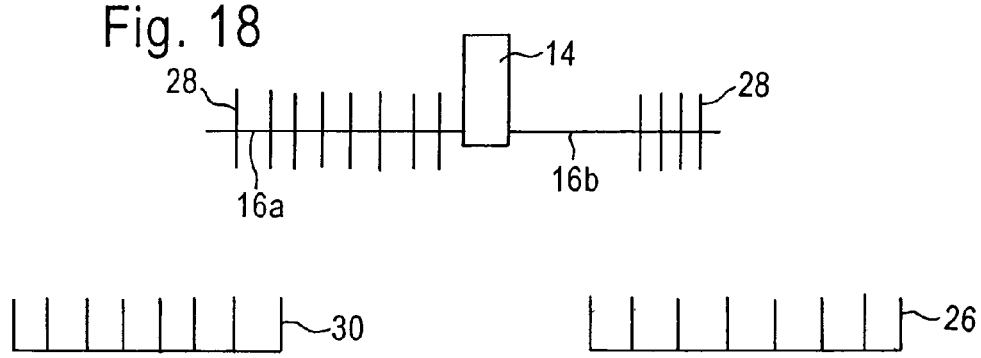

Following the loading of the second pallet 20, the steps depicted in FIGS. 12, 13 and 14 are repeated to load the first mandrel 16a with twenty-five disks from the pick-up comb 26, and the fourteen disks 28 on the second mandrel 16b are moved to the first axial end of the sleeve 40 of the second mandrel 16b using the shuffle comb 30 as depicted in FIGS. 17 and 18. The end-effector 10 is then prepared to load a third pallet 20 that enters the transfer station.

The sequence of transfers of disks 28 depicted in FIGS. 7–18 and described above, is exemplary only, as other sequences of steps and disk lots sizes may be employed without departing from the scope of the present invention.

The present invention thus provides a design that enables entire disk lots to be kept together, as well as provides a sufficient number of disks so that a robot need never return to the combs during the processing of an individual pallet. The two-piece design of the mandrels provides a stiffness and dimensional stability that reduces disk misloads and the need for re-calibration. Further, the two-piece design allows a breakaway of the sleeve from a core to prevent severe misload and prevent any damage from occurring to either the pallet or the mandrels.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A mandrel for transporting disks, comprising:
   a longitudinally extending rigid core;
   a sleeve having an outer circumference with grooves for retaining disks and a bore extending to at least one of the grooves, the core extending in the bore through the sleeve to the at least one of the grooves when the sleeve and core are in an assembled position;
   and a releasable securement arrangement that secures the sleeve on the core and releases the sleeve from the core upon application of a predetermined force on the sleeve.

2. The mandrel of claim 1, further comprising a breakaway sensor coupled to at least one of the core and the sleeve that senses release of the sleeve from the core.

3. The mandrel of claim 2, further comprising a disk presence sensor coupled to the core and detecting presence of a disk.

4. The mandrel of claim 3, wherein the sleeve is plastic and has 25 said grooves.

5. The mandrel of claim 4, wherein the releasable securement arrangement comprises magnets.

6. A mandrel for transporting disks, comprising:
   a sleeve with grooves for retaining disks and a core slidably received within the sleeve; and
   means for releasably securing the sleeve to the core and detecting releasing of the securing of the sleeve to the core.

7. The mandrel of claim 1, wherein the bore extends completely through the sleeve and the core extends completely through the bore when the sleeve and the core are in an assembled position.

* * * * *